(12) United States Patent
Krenzke et al.

(10) Patent No.: US 6,788,114 B1
(45) Date of Patent: Sep. 7, 2004

(54) COMPARATOR WITH HIGH-VOLTAGE INPUTS IN AN EXTENDED CMOS PROCESS FOR HIGHER VOLTAGE LEVELS

(75) Inventors: Rainer Krenzke, Esslingen (DE); Dirk Killat, Kirchheim-Teck (DE)

(73) Assignee: Dialog Semiconductor GmbH, Kirchheim/Teck-Nabern ( * ) Notice: Subject to any disclaimer, the term of this patent is extended or adjusted under 35 U.S.C. 154(b) by 0 days.

(21) Appl. No.: 10/614,663

(22) Filed: Jul. 7, 2003

(30) Foreign Application Priority Data

Jun. 27, 2003 (EP) .......................................... 033920083

(51) Int. Cl.$^7$ .............................................. H03K 5/153
(52) U.S. Cl. .......................................... 327/70; 327/89
(58) Field of Search ........................... 327/52, 56, 60, 327/63, 69–70, 72–73, 77–83, 88–90; 323/315–316

(56) References Cited

U.S. PATENT DOCUMENTS

| | | | |
|---|---|---|---|
| 4,114,149 A | 9/1978 | Kendall ....................... 340/347 |
| 4,199,733 A | 4/1980 | Schade, Jr. ................... 330/277 |
| 5,089,871 A | 2/1992 | Fujihara ..................... 357/23.8 |
| 5,589,785 A | 12/1996 | Garavan ........................ 327/63 |
| 5,600,269 A | 2/1997 | Song et al. .................... 327/52 |
| 6,020,768 A | * 2/2000 | Lim ............................. 327/77 |
| 6,037,890 A | 3/2000 | Glass et al. .................. 341/159 |
| 6,157,220 A | 12/2000 | Broekaert ..................... 327/65 |
| 6,208,174 B1 | 3/2001 | Hopkins ....................... 327/65 |
| 6,232,801 B1 | 5/2001 | Khoury et al. ................. 327/57 |
| 6,377,075 B1 | 4/2002 | Wong ........................... 326/83 |
| 6,424,183 B1 | 7/2002 | Lin et al. ...................... 327/85 |
| 6,452,440 B2 | 9/2002 | Rapp .......................... 327/543 |
| 6,573,760 B1 | * 6/2003 | Gabara ......................... 327/65 |
| 6,630,859 B1 | * 10/2003 | Wang ......................... 327/539 |

OTHER PUBLICATIONS

DS–02–021 to Rainer Krenzke et al., Ser. # 10/615,123, Filed Jul. 8, 2003, "Slew Rate Sensing and Control of a High–Voltage Output Driver for a Variable Voltage Range and Variable Output Load".

U.S. patent App. Pub. US 2001/0007443 A1 to Ono, "Differential Amplifier, Comparater, and A/D Converter", Pub. Date Jul. 12, 2001, Filed Dec. 21, 2000.

* cited by examiner

*Primary Examiner*—My-Trang Nu Ton
(74) *Attorney, Agent, or Firm*—George O. Saile; Stephen B. Ackerman

(57) ABSTRACT

A circuit and method are given, to realize a high voltage comparator, which generates an output signal for follow-up processing in the low-voltage domain. The high-voltage comparison task is essentially replaced by a current comparison, implemented as a combination of a voltage to current transforming stage with a CMOS current comparator circuit, where only very few parts are working in the high voltage domain. Using the intrinsic advantages of that solution the circuit of the invention is manufactured with standard CMOS technology and only four discrete or integrated extended drain MOS components at low cost. This solution reduces the complexity of the circuit and in consequence also power consumption and manufacturing cost.

31 Claims, 2 Drawing Sheets

COMPARATOR WITH HIGH-VOLTAGE INPUTS IN AN EXTENDED CMOS PROCESS FOR HIGHER VOLTAGE LEVELS

RELATED PATENT APPLICATION

This application is related to U.S. patent application docket number DS02-021 Ser. No. 10/615,123, filed on Jul. 8, 2003, and assigned to the same assignee as the present invention.

BACKGROUND OF THE INVENTION (1) Field of the Invention

The invention relates generally to electronic circuits for higher voltages and in particular to comparator circuits realized with integrated-circuit technologies.

(2) Description of the Prior Art

Particularly designed special comparator circuits in electronic applications are required, when it comes to comparing higher voltage levels of e.g. measuring signals and reference signals for sensors and actuators. This is a noted and quite common requirement for electronic circuits as used in the automotive industry, for example. There are very often strong voltage spikes on data lines to be handled, especially when connections to the battery of the car are considered, with its heavy load switching during normal operations. Therefore the handling of higher voltage levels is an elementary demand.

Realizations of the prior art for such comparator circuits are often implemented as specifically tailored semiconductor circuits, fulfilling the operational demands regarding the higher voltages or currents supplied. Therefore, when a direct voltage comparison takes place sometimes DMOS (double diffused) transistor devices are used, making necessary an expensive process in semiconductor fabrication. Alternatively CMOS devices with extended drain realizations are employed, but when used in a differential input pair transistor configuration, high $V_{GS}$ (Gate-Source) values for the transistors have to be specified, which leads also to more expensive components. Furthermore these comparators have to be interconnected with some logic circuitry, which is controlling the overall operation of the electronic circuits incorporating the comparator. These logic circuits or even microprocessor systems normally are working with low voltages. The composition of these two voltage domains— one for higher, the other for lower voltages—has to be made in such a way, that no detrimental influences are affecting onto each other. Thereto an appropriately combined semiconductor technology capable of handling all these demands is chosen, which most often leads to costly solutions. It is therefore a challenge for the designer of such circuits to achieve a high-quality, but lower-cost solution. There are various patents referring to such solutions.

U.S. Pat. No. (6,377,075 to Wong) describes a high voltage protection circuit on standard CMOS process wherein a circuit topology is disclosed for avoiding transistor gate oxide-dielectric breakdown and hot-carrier degradation in circuits, such as CMOS inverters, fabricated in a standard sub-micron CMOS process with feature size below 0.8 μm and gate-oxide thickness less than 150 Å. An inverter circuit according to the invention incorporates four transistors appropriately biased, additional to those of a standard inverter circuit (comprising two transistors), in order to avoid hot-carrier degradation and gate-oxide breakdown. The invention is also applicable to transistor circuits having other functionalities for example logic level translators.

U.S. Pat. No. (6,424,183 to Lin, et al.) discloses a current comparator realized in a low voltage CMOS process, where the presented invention discloses a current comparator having simple, cheap and fast characteristics, especially discloses a current comparator having a small dead zone and excellent driving capability.

U.S. Pat. No. (6,452,440 to Rapp) shows a voltage divider circuit, wherein a charge pump system includes a charge pumping circuit for outputting a high voltage $V_{pp}$ at a node. An oscillator circuit, coupled to the charge pumping circuit, drives the charge pumping circuit with at least one clock signal. A current source generates a pulldown current. A voltage divider circuit is coupled between the node and the current source. The voltage divider circuit cooperates with the current source to form a feedback loop for controlling the oscillator circuit to run at variable, optimum frequency for controlling the rate-of-rise and the amplitude of the voltage $V_{pp}$ while minimizing power-supply current drain.

SUMMARY OF THE INVENTION

A principal object of the present invention is to provide an effective and very producible method and circuit for comparing voltage signals of higher input levels.

Another further object of the present invention is to replace a comparison of voltages by a comparison of currents.

Another still further object of the present invention is to reach a transformation of high-voltage signals into current signals at lower voltages.

A still further object of the present invention is to reduce the power consumption of the circuit by realizing inherent appropriate design features.

Another object of this invention is its producibility as a monolithic semiconductor integrated circuit.

Also an object of the present invention is to reduce the cost of manufacturing by implementing the circuit as a monolithic integrated circuit in low cost CMOS technology.

Also another object of the present invention is to reduce cost by effectively minimizing the number of expensive components.

In accordance with the objects of this invention, a method for realizing a high voltage comparator is presented. Said method includes providing a voltage to current conversion stage branch for the $V_{Inp}$ signal, a voltage to current conversion stage branch for the $V_{Ref}$ signal, a reference signal providing circuit, and a current comparator block, generating an output signal. Also included in said method is transforming static high supply voltage levels into static currents as well as transforming a high-voltage input signal into a proportional current signal and transforming a high-voltage reference into a proportional current reference. Further comprises said method combining said static currents and proportional current signals into two resulting current input signals and feeding said resulting current input signals into a current comparator circuit operating in the low-voltage domain. Equally included in said method is comparing said current input signals within said current comparator circuit and generating a low voltage output signal representing the result of said high input voltage comparison.

Also in accordance with the objects of this invention, a circuit, capable of comparing higher voltage signals is achieved and which generates an output signal for follow-up processing in the low-voltage domain. Said circuit comprises means for transforming a static high voltage supply level into static currents, as well as means for transforming a high voltage input signal into a proportional current signal and means for transforming a high voltage reference into a proportional current reference. Further on includes said circuit means for combining said static current and said proportional current signal into a resulting current input signal and also means for combining said static current and said reference current signal into a resulting reference current input. Also incorporated are means for feeding said resulting current input signal and said reference current into a current comparison circuit, which serves as means for comparing said current input signal and said reference current, designated as current comparator. Finally comprises said circuit means for generating a low voltage output signal describing the relation of said high voltage input signal and said reference input to each other.

BRIEF DESCRIPTION OF THE DRAWINGS

In the accompanying drawings forming a material part of this description, the details of the invention are shown.

DESCRIPTION OF THE PREFERRED EMBODIMENTS

The preferred embodiments disclose a novel circuit for a comparator of high voltage signals and a method of transforming a high voltage comparison into a current comparison at low voltages.

The description of the preferred embodiment of the invention is elaborated now by explaining the circuit on the one hand and by presenting the method on the other hand.

Figure 1:
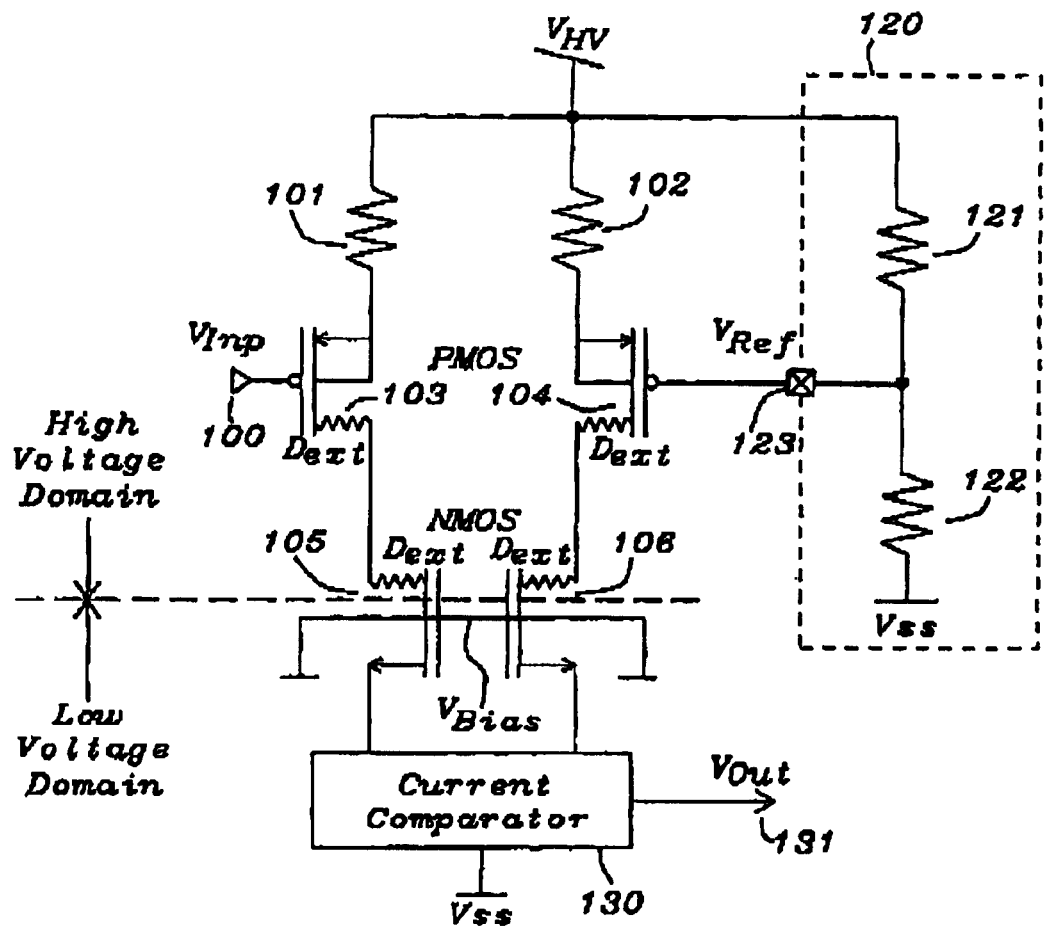
FIG. 1 illustrates the electrical circuit schematics with an internal circuit block named current comparator for the preferred embodiment of the present invention.

Referring now to FIG. 1, the preferred embodiment of the circuit of the present invention is illustrated. The essential functional components of the comparator according to the invention are shown in FIG. 1 in the form of a combined circuit schematic and block diagram. Starting off with two identically built-up branches, each consisting of a resistor— 101 resp. 102—, a PMOS transistor—103 resp. 104—and an NMOS transistor—105 resp. 106—, all connected in series—items 101, 103 and 105; resp. 102, 104 and 106— and both together supplied from the high-voltage supply $V_{HV}$, operating in the high-voltage domain the two high-voltage signals $V_{Inp}$ at pin 100 and $V_{Ref}$ at pin 123 are processed in voltage to current conversion stages. Both stages are feeding their output currents as inputs into the current comparator block 130 "Current Comparator", where, henceforth in the low-voltage domain, the two corresponding currents,—corresponding to the high-voltage signals $V_{Inp}$ and $V_{Ref}$ respectively—are now compared in said "Current Comparator", which itself is entirely being operated in the low voltage domain. The borderline between the high voltage and the low voltage domain is clearly shown as a dashed line in FIG. 1. The functional principle of this border and gain stages shall be explained now. Each gain stage consists of three components. A resistor connected to said high voltage supply $V_{HV}$, which itself leads to the source of a first MOS transistor in p-channel technology, PMOS. The gate of each of said PMOS transistors is driven with the respective $V_{Inp}$ signals. The PMOS transistors are operated as source followers and form together with the source side connected resistors a voltage to current converter. The drain of said PMOS transistors (implemented with an extended drain design) is in turn connected with the drains of a second MOS transistor in n-channel technology, NMOS. The NMOS transistors serve as decoupling elements for the separation of the high voltage and the low voltage domains. The gate bias voltage $V_{Bias}$ for the NMOS transistors needs to be a voltage level within the low voltage domain and defines by the appr. resulting source voltage level the operating voltage range of the current comparator circuit. Usually $V_{Bias}$ can be easily choosen as being of the same voltage level as the low voltage domain supply level. Said drain of said NMOS transistors is equally fabricated with an extended drain design. The sources of said NMOS transistors are now feeding their currents into the $V_{Inp}$ terminals of said "Current Comparator" circuit block, whose output signal (item 131) is named as $V_{Out}$. Looking back again, at that voltage domain separation line in FIG. 1, passing through the NMOS transistors—the lower ones of the PMOS and NMOS transistor pairs—it is recognized, that the high voltage isolation barrier is built with said special drains $D_{ext}$, manufactured as extended drain designs of said transistors. Extended drain design for CMOS transistors signifies in that context, that the common, for source and drain substantially symmetrical layout of CMOS devices, fabricated with a standard CMOS process, is modified in such a way, that now between gate and drain an extra space, covered with additional field oxide is introduced. This type of transistor therefore is now substantially unsymmetrical. The breakthrough voltage $V_{GD}$ (Gate-Drain) is thus raised to e.g. about 40 V by this measures, a CMOS process feature size down to 0.35 $\mu$m presumed. In turn the breakthrough voltage $V_{DS}$ (Drain-Source) is also elevated to about 40 V. These are values currently achievable by semiconductor foundries; it may be noted, that these values are strongly depending on the CMOS feature size. It is evident, that the extra masks and fabrication steps for extended drain devices are influencing the cost of production.

The voltage reference signal $V_{Ref}$, as shown in FIG. 1, is generated here with the help of a simple resistive (resistors 121 & 122) voltage divider-contained in the dashed block 120—, which is naturally replaceable by semiconductor circuits. The reference signal is therefore proportional to the high voltage supply $V_{HV}$ but could also be an absolute reference level. For clarification, the terms low and high voltage domain are now defined more precisely. The voltages for powering said logic circuit blocks in the low voltage domain come from a low voltage supply, usually named as $V_{DD}$ (common supply voltages of todays CMOS technologies). The high voltage domain is connected to said supply voltage $V_{HV}$,—of ranges e.g. up to 30 V. The voltage indication $V_{SS}$ signifies ground potential. All the ground terminals of the circuit are connected to that voltage $V_{ss}$.

Figure 2:
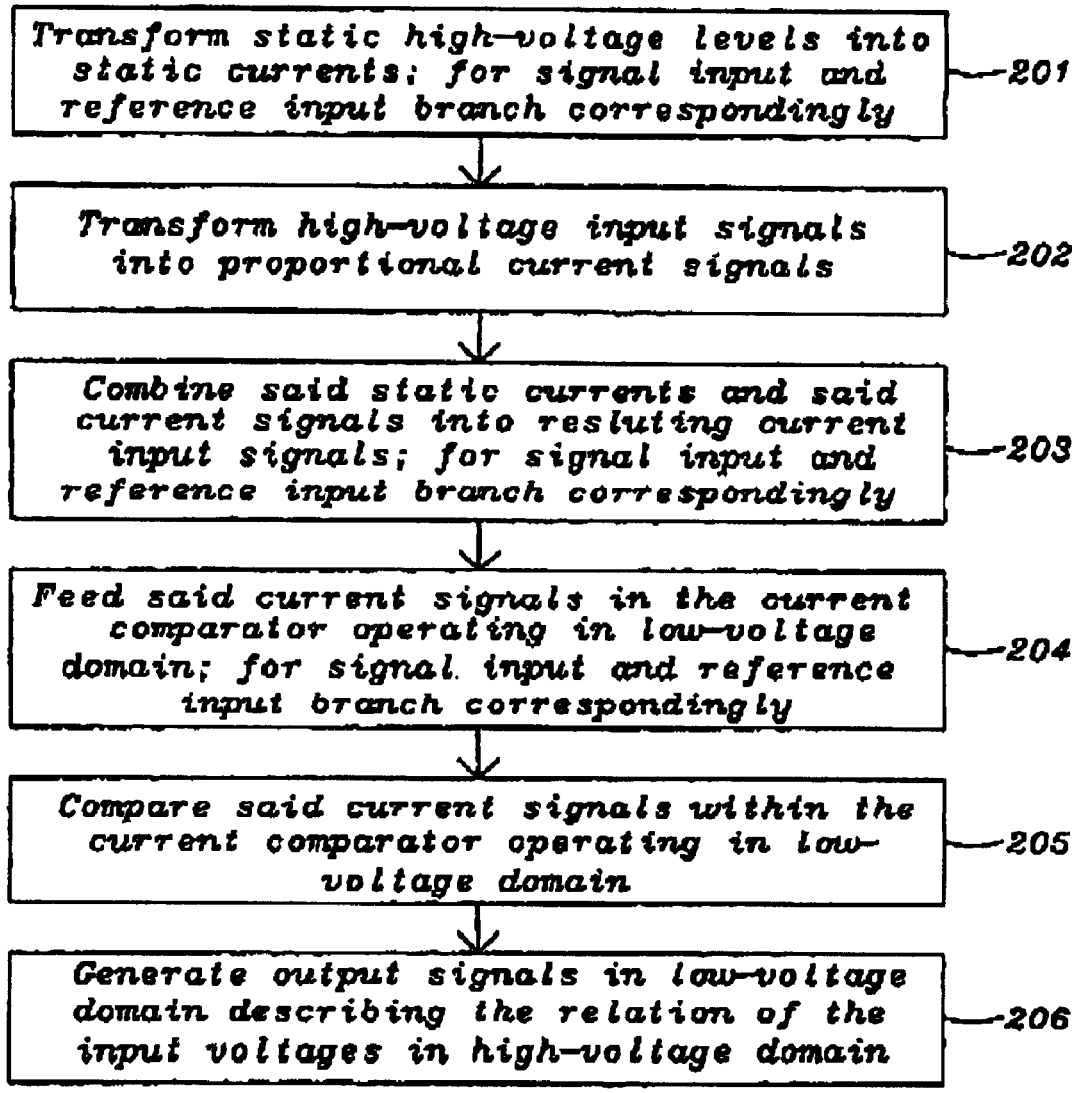
FIG. 2 illustrates the method how to accomplish the comparison of high voltages with the circuit of the invention.

FIG. 2 illustrates the method how to realize the comparison of high voltages with the circuit of the invention, as described and explained before.

As a first step 201 is described, how to transform the static high-voltage supply levels into static supply currents; for the signal input and the reference in put branch correspondingly. With step 202 the high-voltage input signal is then transformed into proportional current signal. In step 203 said static supply currents and said input signal current are then combined into resulting current input signals; again for each branch respectively. Step 204 feeds said current signals into the current comparator block, which is operating in low-voltage domain; always handling each branch accordingly. Within step 205 the comparison of said current signals within the current comparator operating in low-voltage domain is effected. Finally in step 206, the wanted output signal is generated, which describes now completely in the low-voltage domain the mutual relations of the input signals from the high-voltage domain.

As shown in the preferred embodiments, this novel circuit provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A method for realizing a high voltage comparator comprising:

transforming static high supply voltage levels into static currents;

transforming a high-voltage input signal into a proportional current signal;

transforming a high-voltage reference into a proportional current reference;

combing said static currents and proportional current signal into a resulting current input signal; combining said static currents and said proportional current reference into resulting reference current input;

feeding said resulting current input signal and said resulting reference current input into a current comparator circuit operating in a low-voltage domain;

comparing said resulting current input signal and said resulting reference current input within said current comparator circuit; and generating a low voltage output signal representing the result of said current comparator circuit.

2. The method according to claim 1 wherein said step of transforming the static high voltage supply levels into the static currents is implemented using a resistor.

3. The method according to claim 1 wherein said step of transforming the static high voltage supply levels into the static currents is implemented using an equivalent resistor circuit built of semiconductor circuits.

4. The method according to claim 1 wherein said step of transforming the high-voltage input signal into the proportional current signal is implemented using a voltage to current conversion stage.

5. The method according to claim 1 wherein in said step of transforming the high-voltage reference into the proportional current reference uses a voltage proportional to the high voltage supply.

6. The method according to claim 5 wherein said voltage proportional to the high voltage supply is realized with a resistive divider consisting of two resistors.

7. The method according to claim 5 wherein said voltage proportional to the high voltage supply is realized with an equivalent resistive divider built of semiconductor circuits.

8. The method according to claim 1 wherein in said step of transforming the high-voltage reference into the proportional current reference uses an absolute reference voltage.

9. The method according to claim 8 wherein in said absolute reference voltage is implemented with the help of a separate internal semiconductor reference circuit.

10. The method according to claim 4 wherein said voltage to current conversion stage is implemented using a PMOS transistor, configured as a source follower working together with an NMOS transistor, which is employed as decoupling element for the low voltage domain.

11. The method according to claim 4 wherein said gain stage is implemented using a PMOS transistor with extended drain, configured as a source follower working together with an NMOS transistor, which is employed as decoupling element for the low voltage domain.

12. The method according to claim 4 wherein said gain stage is implemented using a PMOS transistor, configured as a source follower working together with an NMOS transistor with extended drain, which is employed as decoupling element for the low voltage domain.

13. The method according to claim 4 wherein said gain stage is implemented using a PMOS transistor with extended drain, configured as a source follower working together with an NMOS transistor with extended drain, which is employed as decoupling element for the low voltage domain.

14. A circuit, capable of comparing higher voltage signals, comprising:

means for transforming a static high voltage supply level into static currents;

means for transforming a high voltage input signal into a proportional current signal;

means for transforming a high voltage reference input into a proportional current reference;

means for combining said static current and said proportional current signal into a resulting current input signal;

means for combining said static current and said proportional reference current into a resulting reference current input;

means for feeding said resulting current input signal and said resulting reference current into a current comparison circuit;

means for comparing said resulting current input signal and said resulting reference current, designated as said current comparison circuit; and means for generating a low voltage output signal describing the relation of said high voltage input signal and high voltage reference input representing the result of said current comparison circuit.

15. The circuit according to claim 14 wherein said means for transforming the static high voltage supply level into the static currents is a resistor.

16. The circuit according to claim 14 wherein said means for transforming the static high voltage supply level into the static currents is an equivalent resistor circuit built of semiconductor circuits.

17. The circuit according to claim 14 wherein said means for transforming the high voltage reference input into the proportional current reference uses a voltage proportional to the high voltage supply.

18. The circuit according to claim 17 wherein said voltage proportional to the high voltage supply is realized with a resistive divider consisting of two resistors.

19. The circuit according to claim 17 wherein said voltage proportional to the high voltage supply is realized with an equivalent resistive divider circuit built of semiconductor circuits.

20. The circuit according to claim 14 wherein said means for transforming the high-voltage reference into the proportional current reference uses an absolute reference voltage.

21. The circuit according to claim 20 wherein said absolute reference voltage is implemented with the help of a separate internal semiconductor reference circuit.

22. The circuit according to claim 14 manufactured with the help of discrete active and passive components.

23. The circuit according to claim 14 manufactured with the help of discrete components and integrated circuits.

24. The circuit according to claim 14 manufactured in integrated circuit technology.

25. The circuit according to claim 14 manufactured in monolithic integrated circuit technology.

26. The circuit according to claim 14 manufactured in monolithic integrated CMOS technology.

27. The circuit according to claim 14 manufactured in monolithic integrated CMOS circuit technology with additional discrete PMOS and NMOS transistors.

28. The circuit according to claim 27 manufactured in monolithic integrated CMOS circuit technology with additional discrete PMOS and NMOS transistors with extended drain technology.

29. The circuit according to claim 14 manufactured in monolithic integrated CMOS technology with additional PMOS and NMOS transistors, assembled in Chip-On-Chip technology.

30. The circuit according to claim 29 manufactured in monolithic integrated CMOS technology with additional PMOS and NMOS transistors with extended drain technology, assembled in Chip-On-Chip technology.

31. The circuit according to claim 14 wherein said means for comparing said current input signal and said reference current, designated as current comparator, is implemented in low voltage CMOS technology.

* * * * *